(12) United States Patent
Yamada

(10) Patent No.: US 6,504,239 B1
(45) Date of Patent: Jan. 7, 2003

(54) SEMICONDUCTOR DEVICE HAVING DUMMY PATTERN THAT RELIEVES STRESS

(75) Inventor: Shigeru Yamada, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/524,000

(22) Filed: Mar. 13, 2000

(30) Foreign Application Priority Data

Jun. 25, 1999 (JP) .......................................... 11-179641
Mar. 7, 2000 (JP) ....................................... 2000-061631

(51) Int. Cl.⁷ .......................... H01L 23/48; H01L 29/40; H01L 23/52
(52) U.S. Cl. ...................... 257/678; 257/737; 257/738; 257/780; 257/693; 257/692; 257/691; 257/784; 257/786; 257/787; 257/783; 257/676; 361/774; 361/777
(58) Field of Search ................................. 257/783, 678, 257/778, 737, 738, 734, 787, 668, 676, 693, 692, 786, 780, 784, 691, 666; 361/774, 777

(56) References Cited

U.S. PATENT DOCUMENTS 5,677,575 A * 10/1997 Maeta et al. ................. 257/778
6,093,971 A * 7/2000 Oppermann et al. ......... 257/783
6,198,165 B1 * 3/2001 Yamaji et al. ............... 257/734
6,204,559 B1 * 3/2001 Lin et al. ..................... 257/738
6,229,217 B1 * 5/2001 Fukui et al. ................. 257/777
6,242,815 B1 * 6/2001 Hsu et al. .................... 257/786

* cited by examiner

*Primary Examiner*—Alexander O. Williams
(74) *Attorney, Agent, or Firm*—Volentine Francos, P.L.L.C.

(57) ABSTRACT

A semiconductor device includes a base substrate which has four sides, a first major surface and a second major surface opposite to the first major surface, and a semiconductor chip which is mounted on the first major surface and has an electrode formed thereon. The semiconductor device also has a bonding pad which is formed on the first major surface, a wiring pattern which is formed on the first major surface and is connected to the wiring pattern, and a bonding wire which connects the electrode of the semiconductor chip to the bonding pad. The semiconductor device also has a dummy pattern which is formed on the first major surface positioned between the center of one side and the semiconductor chip, and a sealing resin which covers the semiconductor chip, the bonding wire, the bonding pad and a part of the dummy pattern.

20 Claims, 10 Drawing Sheets

SEMICONDUCTOR DEVICE HAVING DUMMY PATTERN THAT RELIEVES STRESS

BACKGROUND OF THE INVENTION

1. Field of the Invention

The present invention generally relates to a semiconductor device, and more particularly, to a surface mount type and a resin sealed type semiconductor package.

This application is counterparts of Japanese patent applications, Serial Number 179641/1999, filed Jun. 25, 1999 and Serial Number 61631/2000, filed Mar. 7, 2000, the subject matter of which is incorporated herein by reference.

2. Description of the Related Art

FIG. 1 is a top plan view showing a conventional semiconductor device. FIG. 2 is a cross sectional view taken on line 2–2' of FIG. 1.

The conventional semiconductor device has a base substrate 101 which is made of glass epoxy, ceramic or polyimide.

The base substrate 101 has a plurality of through holes 107 which penetrate the base substrate 101 and extend from a front surface of the base substrate 101 to a back surface of the base substrate 101. A plurality of bonding pads 105 and a plurality of wiring patterns 103 which connect the bonding pads 105 to corresponding through hole 107 are formed on the front surface of the base substrate 101.

A solder resist layer 109 is formed on a region of the front surface of the base substrate 101 except for regions where the bonding pads 105 are formed.

A semiconductor chip 113 is attached to the center of the front surface of the base substrate 101 through the solder resist layer 109 and an adhesive 111 such as a silver paste.

Electrodes formed on the semiconductor chip 113 are connected to corresponding bonding pad 105 by corresponding bonding wire 115.

A sealing resin 117 is provided on a sealing area of the front surface of the base substrate 101 and thus the semiconductor chip 113, the bonding wires 115, the bonding pads 105, the wiring patterns 103 and the through holes 107 are sealed by the sealing resin 117.

A plurality of wiring patterns 119 connected to the through holes 107 are formed on the back surface of the base substrate 101. A plurality of solder balls 121 are formed on the wiring patterns 119.

The conventional semiconductor device as explained above is mounted on a mother board, not shown, such as an electric device.

However, the conventional semiconductor device has a problem explained hereinafter.

The semiconductor device is subjected to a thermal treatment process such as a reflow process when the semiconductor device is mounted on the mother board. In the thermal treatment process, moisture included in the adhesive 111 or moisture at an interface between the adhesive 111 and the solder resist layer 109 below the semiconductor chip 113 vaporizes. Stress occurs at the semiconductor device due to the moisture vaporizing. The stress is concentrated on a region between the semiconductor chip 113 and the center of sides of the base substrate 101. Since the stress is particularly concentrated at a region between the semiconductor chip 113 and the center of long sides of the base substrate 101, strong stress occurs at the sealing resin 117, the solder resist layer 109, and the base substrate 101 which are positioned at the region.

Therefore, as described below, there is a possibility that three defective modes occur.

1. a crack which occurs in the sealing resin 117.
2. the solder resist layer 109 is peeled off from the base substrate 101.
3. the sealing resin 117 is peeled off from the solder resist layer 109.

Where such cracks and peeling off occur, there is a possibility that the semiconductor device become defective.

Consequently, there has been a need for an improved semiconductor device.

SUMMARY OF THE INVENTION

It is an object of the present invention is to provide a semiconductor device that may relieve stress effectively.

It is another object of the present invention is to provide a semiconductor device having a stable resin sealing process.

It is still another object of the present invention is to provide a semiconductor device having a simplified production process.

According to one aspect of the present invention, for achieving one or more of the above objects, there is provided a semiconductor device which includes a base substrate which has four sides, a first major surface and a second major surface opposite to the first major surface, a semiconductor chip which is mounted on the first major surface and has an electrode formed thereon. The semiconductor device also has a bonding pad which is formed on the first major surface, a wiring pattern which is formed on the first major surface and is connected to the wiring pattern and a bonding wire which connects the electrode of the semiconductor chip to the bonding pad. The semiconductor device also has a dummy pattern which is formed on the first major surface positioned between the center of one side and the semiconductor chip and a sealing resin which covers the semiconductor chip, the bonding wire, the bonding pad and a part of the dummy pattern.

According to another aspect of the present invention, for achieving one or more of the above objects, there is provided a semiconductor device which includes a base substrate which has four sides, a first major surface and a second major surface opposite to the first major surface and a semiconductor chip which is mounted on the first major surface and has an electrode formed thereon. The semiconductor device further includes a bonding pad which is formed on the first major surface, a wiring pattern which is formed on the first major surface and is connected to said wiring pattern and a bonding wire which connects the electrode of the semiconductor chip to the bonding pad. The semiconductor device further includes a dummy pattern which is formed on the first major surface positioned between the center of one side and the semiconductor chip and has an adhesion strength against a sealing resin lower than that of the semiconductor chip. The semiconductor device further includes the sealing resin which covers the semiconductor chip, the bonding wire, the bonding pad and a part of the dummy pattern.

According to still another aspect of the present invention, for achieving one or more of the above objects, there is provided a semiconductor device which includes a base substrate which has four sides, a first major surface and a second major surface opposite to the first major surface, a semiconductor chip which is mounted on the first major surface and has an electrode formed thereon. The semiconductor device also inculudes a bonding pad which is formed on the first major surface, a wiring pattern which is formed on the first major surface and is connected to the wiring pattern and a bonding wire which connects the electrode of the semiconductor chip to the bonding pad. The semiconductor device also includes an insulating layer which is formed over the first major surface except for the bonding pad and has a first region positioned between the center of one side of the base substrate and the semiconductor chip and second region, an adhesion strength of the first region against a sealing resin is lower than that of the second region. The semiconductor device also includes the sealing resin which covers the semiconductor chip, the bonding wire, the bonding pad, a part of the first region and a part of the second region.

The above and further objects and novel features of the invention will more fully appear from the following detailed description, appended claims and the accompanying drawings.

DETAILED DESCRIPTION OF THE PREFERRED EMBODIMENTS

First Preferred Embodiment

Figure 1:
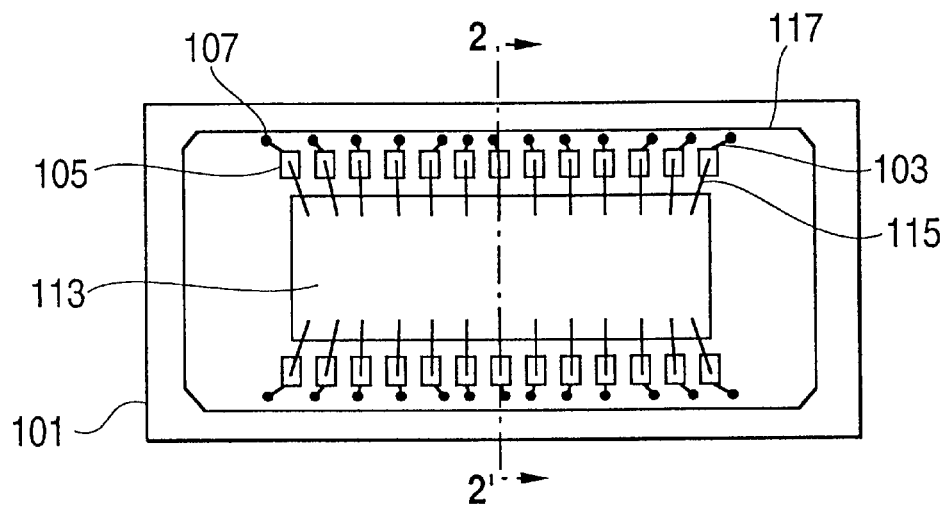
FIG. 1 is a top plan view showing a conventional semiconductor device.
Figure 2:
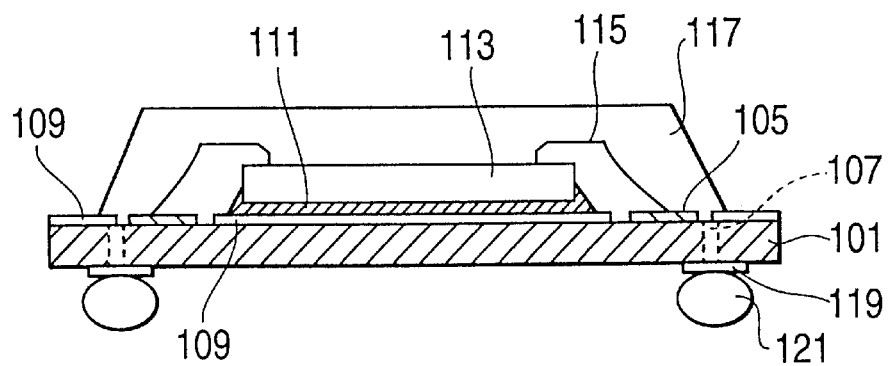
FIG. 2 is a cross sectional view taken on line 2–2' of FIG. 1.

A semiconductor device according to preferred embodiments of the present invention will be explained hereinafter with reference to figures. In order to simplify explanation, like elements are given like or corresponding reference numerals through this specification and figures. Dual explanations of the same elements are avoided.

Figure 3:
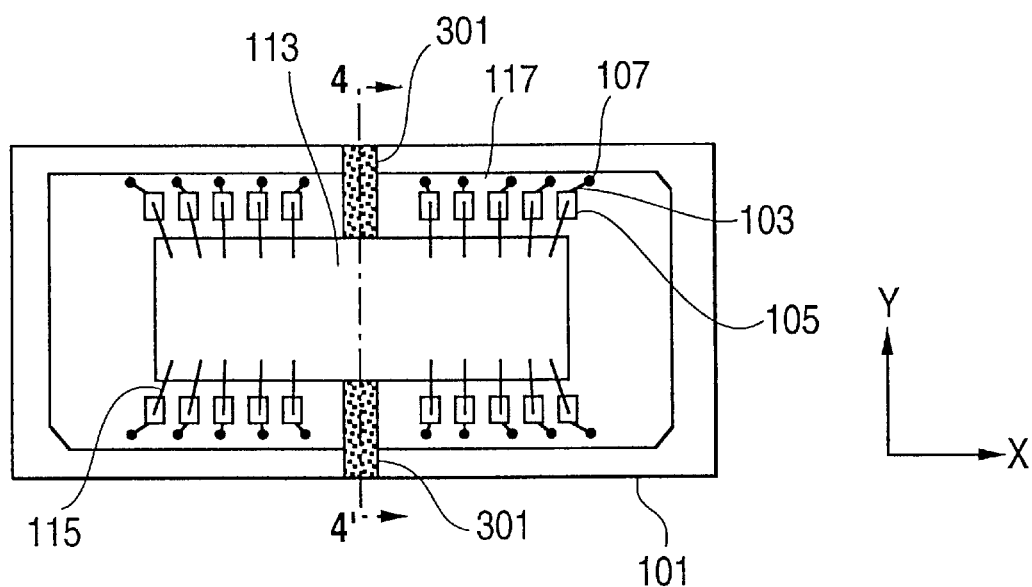
FIG. 3 is a top plan view showing a semiconductor device according to a first preferred embodiment of the present invention.
Figure 4:
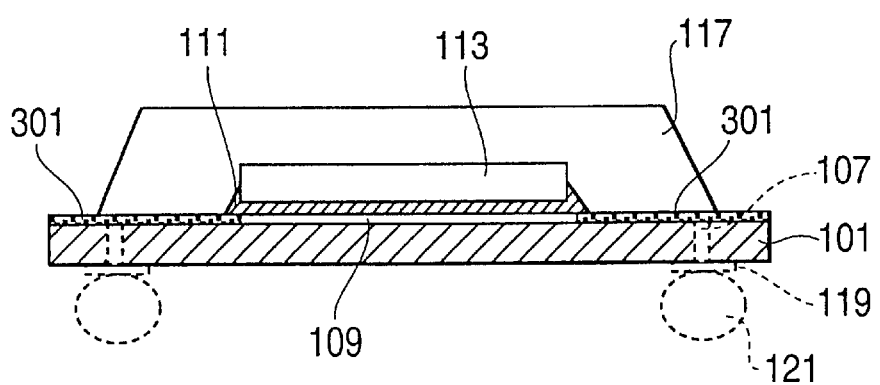
FIG. 4 is a cross sectional view taken on line 4–4' of FIG. 3.

FIG. 3 is a top plan view showing a semiconductor device according to a first preferred embodiment of the present invention. FIG. 4 is a cross sectional view taken on line 4–4' of FIG. 3.

The semiconductor device has a base substrate 101 which is made of glass epoxy, ceramic or polyimide. The base substrate 101 has a four-sided shape including two long sides and two short sides. The base substrate 101 is preferably a rectangular shape.

The base substrate 101 also has a plurality of through holes 107 which penetrate the base substrate 101 and extend from a front surface of the base substrate 101 to a back surface of the base substrate 101.

A plurality of bonding pads 105 and a plurality of wiring patterns 103 which connect the bonding pads 105 to corresponding through hole 107 are formed on the front surface of the base substrate 101. The wiring pattern 103 is also called a trace in this technical field. The bonding pad 105 and the wiring pattern 103 are made of copper.

Plated dummy patterns 301 are formed on the front surface of the base substrate 101 between a semiconductor chip 113 and the center of long sides of the base substrate 101. More precisely, the dummy pattern 301 is composed of a copper foil pattern, a copper plating layer formed on the copper foil pattern, a nickel plating layer formed on the copper plating layer and a gold plating layer formed on the nickel plating layer. The gold plating layer as the top layer of the dummy pattern 301 has a relatively low adhesion strength to a sealing resin 117. The dummy pattern 301 is a dummy pattern that is not connected to any electrodes of the semiconductor chip 113.

The semiconductor chip 113 is attached to the center of the front surface of the base substrate 101 through a solder resist layer 109 and an adhesive 111 such as a silver paste.

The solder resist layer 109 is formed on the overall front surface of the base substrate 101 except for the bonding pads 105 and the dummy pattern 301.

The solder resist layer 109 is made of insulating material. The solder resist layer 109 has a relatively high adhesion strength to the sealing resin 117. Especially, the adhesion strength of the solder resist layer 109 is higher than that of the gold plating layer.

Electrodes formed on the semiconductor chip 113 are connected to corresponding bonding pad 105 by corresponding bonding wire 115.

The sealing resin 117 is provided on and over the semiconductor chip 113, the bonding wires 115, the bonding pads 105, the wiring patterns 103, the through holes 107 and the dummy pattern 301. Thus, these are sealed by the sealing resin 117. The sealing resin 117 is made of epoxy resin.

A plurality of wiring patterns 119 connected to the through holes 107 are formed on the back surface of the base substrate 101. A plurality of solder balls 121 are formed on the wiring patterns 119.

In FIG. 4, since the wiring patterns 119, the solder balls 121 and through holes 107 exist at another cross section, these elements are indicated by dotted lines.

Next, a method for making a semiconductor device according to the present invention and illustrated in FIG. 3 will be explained hereinafter with reference to FIG. 5 and FIG. 6.

FIG. 5 and FIG. 6 are process diagrams showing the method for making the semiconductor device according to the first preferred embodiment of the present invention.

Figure 5A:
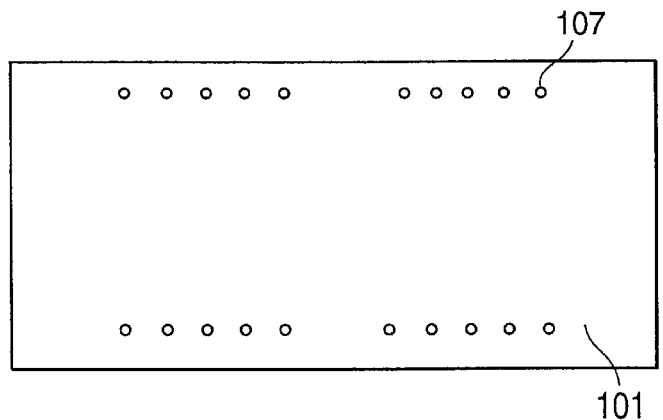
FIG. 5(a) through FIG. 5(c) are process diagrams showing a method for making a semiconductor device according to a first preferred embodiment of the present invention.

First, as shown in FIG. 5(a), the base substrate 101 having the copper foil which is formed on the front and back surfaces thereof is provided.

Next, the through holes 107 are drilled through the copper foil and the base substrate 101. Or the through holes 107 are formed in the base substrate 101 by using a laser beam.

Figure 5B:
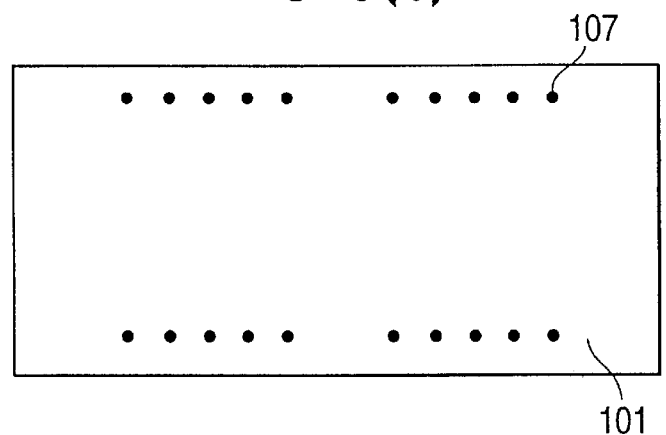

Next, as shown in FIG. 5(b), sides of the through holes 107 are plated with copper. In this time, the front and back surfaces of the base substrate 101 are also plated with the copper.

Figure 5C:
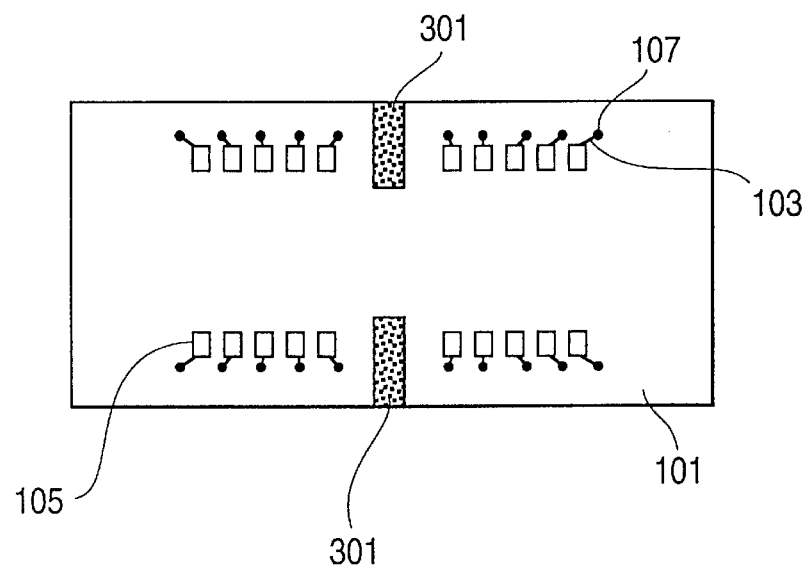

Next, as shown in FIG. 5(c), the dummy patterns 301, the bonding pads 105, the wiring patterns 103 and the wiring patterns 119 are formed on both surfaces of the base substrate 101 by sequentially photolithographically masking and etching the copper foil formed on both surfaces of the base substrate 101.

It should be noted that the wiring patterns 119 are not illustrated because the wiring patterns 119 are formed on the back surface of the base substrate 101. Further, in order to simplify explanations, explanations and illustration with respect to the back surface of the base substrate 101 are omitted.

Figure 6A:
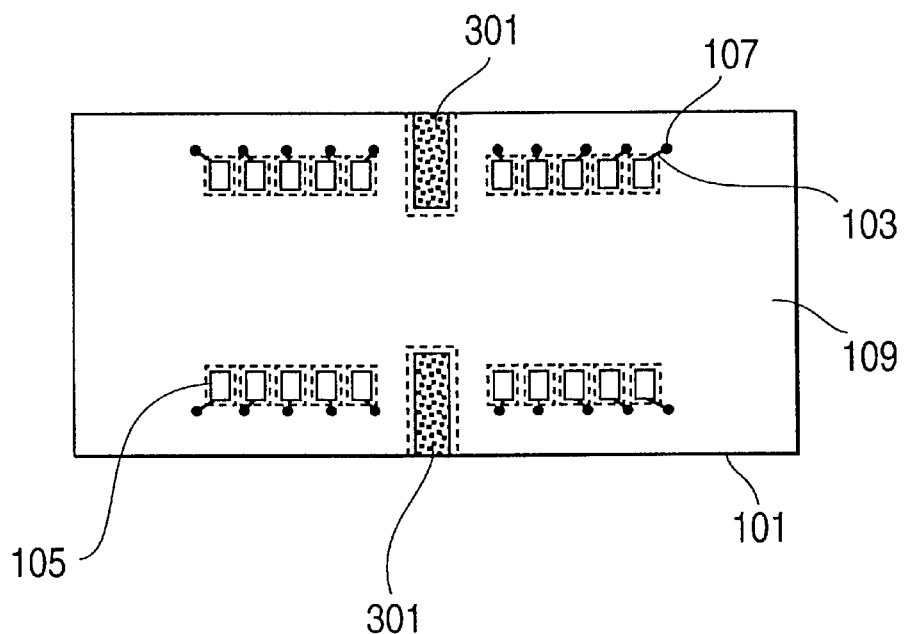
FIG. 6(a) through FIG. 6(b) are process diagrams showing a method for making a semiconductor device according to a first preferred embodiment of the present invention.

Next, as shown in FIG. 6(a), the solder resist layer 109 is formed over the overall front surface of the base substrate 101 except for the bonding pads 105 and the dummy patterns 301.

Thereafter, the nickel and the gold are sequentially plated to exposed surfaces of the bonding pads 105 and the dummy patterns 301 by using the solder resist layer 109 as a mask. As a result, the bonding pad 105 and the dummy pattern 301 each of which has a laminated layer comprising the gold plating layer, the nickel plating layer and the copper plating layer can be obtained.

In this time, in order to enhance the adhesion strength against the sealing resin 117, an ashing process using ultraviolet rays or plasma may be applied to a surface of the solder resist layer 109. The adhesion strength of the solder resist layer 109 applied to the ashing process is higher than that of the solder resist layer not aplied to the ashing process.

Figure 6B:
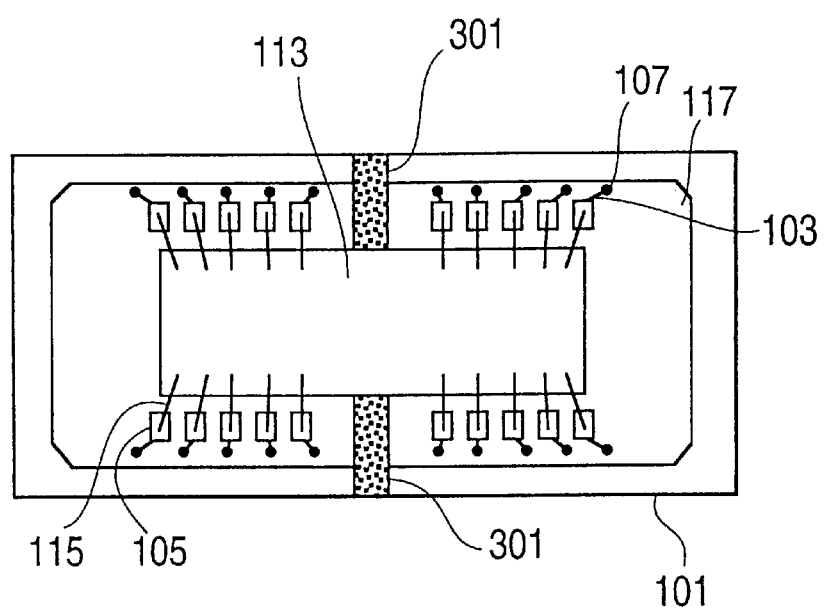

Next, as shown in FIG. 6(b), the electrodes on the semiconductor chip 113 are wire-bonded to the bonding pads 105 by the bonding wires 115.

Thereafter, the sealing resin 117 is provided on a resin seal region of the front surface of the base substrate 101. Thus, the semiconductor chip 113, the bonding wires 115, the bonding pads 105, the wiring patterns 103, the through holes 107 and a part of the dummy patters 301 are covered with the sealing resin 117.

Thereafter, the solder balls 121 are mounted on the wiring patterns 119 of the back surface of the base substrate 101 and thus the semiconductor device is completed.

The semiconductor device described above is mounted on a mother board such as an electric device not illustrated.

First, the semiconductor device is placed on the mother board so that the solder balls 121 are positioned on solder pads arranged on the mother board.

Thereafter, the semiconductor device and the mother board are inserted into a reflow furnace whose inside atmosphere is maintained at about 230° C. As a result, the solder balls 121 are melted due to the temperature and thus the solder balls 121 are electrically connected to the solder pads on the mother board. This is called a reflow process.

Moisture included in the adhesive 111 or moisture at an interface between the adhesive 111 and the solder resist layer 109 below the semiconductor chip 113 vaporizes because of the temperature of the reflow process. Stress occurs at the semiconductor device due to pressure caused by the moisture vaporizing. The stress is concentrated on a region between the semiconductor chip 113 and the center of sides of the base substrate 101. Since the stress is particularly concentrated at a region between the semiconductor chip 113 and the center of long sides of the base substrate 101, strong stress occurs at the sealing resin 117, solder resist layer 109, and the base substrate 101 which are positioned at the region.

However, the dummy patterns 301 having the relatively low adhesion strength against the sealing resin 117 are provided at the region. Therefore, the concentrated stress can be relieved at interfaces between the dummy patterns 301 and the sealing resin 117.

The dummy patterns 301 are preferably formed on a region between the semiconductor chip 113 and the long sides of the base substrate 101 in order to relieve the stress effectively. Furthermore, width of the dummy patterns 301 in an x-direction illustrated in FIG. 3 are preferably equal to or more than 0.5 mm. Furthermore, the dummy patterns 301 preferably extend from at least under the sealing resin 117 to the long sides of the base substrate 101 (that is, edges of the base substrate 101).

As explained above, in the semiconductor device according to the first preferred embodiment of the present invention, since the dummy pattern 301 having the relatively low adhesion strength against the sealing resin 117 is provided at the stress concentrated region, the stress which occurs during the reflow process can be relieved at the interface between the dummy pattern 301 and the sealing resin effectively.

Therefore, the crack and the peeling off can be prevented. As a result, a withstand characteristic of the semiconductor device against the reflow process can be sharply improved.

The dummy patterns 301 are formed substantially simultaneously with the wiring patterns 103 and the bonding pads 105 during the formation of the wiring pattern 103 and the bonding pad 105. Since any special processes of a structure for relieving the stress are not needed, overall assembly costs can be prevented from being risen sharply.

Furthermore, most of the sealing resin 117 is contacted with the solder resist layer 109 and the surface of the semiconductor chip 113 each of which has the relatively high adhesion strength against the sealing resin 117, there is no problem with respect to reliability of the semiconductor device.

The adhesive strength of the solder resist layer 109 not applied to the ashing process is lower than that of the solder resist layer applied to the ashing process, and is higher than that of the gold plating layer.

The adhesive strength of the nickel plating layer against the sealing resin 117 is lower than that of the gold plating layer.

Figure 7:
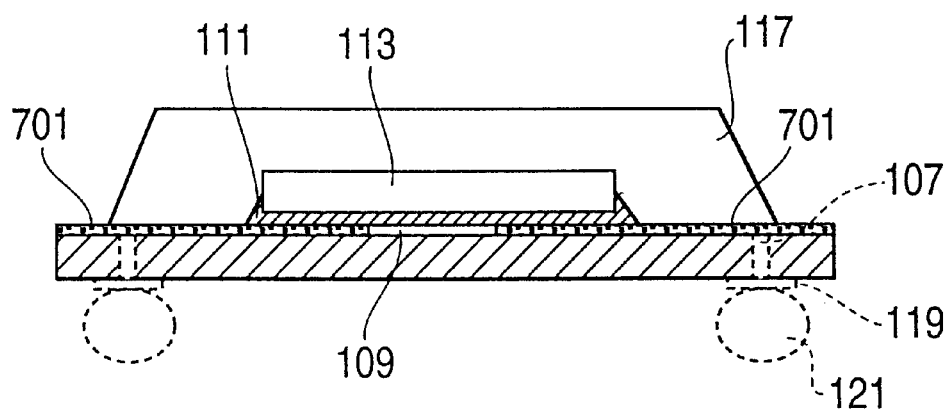
FIG. 7 is a cross sectional view showing a variation of a first preferred embodiment of the present invention.

FIG. 7 is a cross sectional view showing a variation of the first preferred embodiment of the present invention. The difference between FIG. 7 and FIG. 3 resides in the shape of dummy patterns 701. Elements except for the dummy patterns 701 are the same as those of FIG. 3.

As illustrated in FIG. 7, the dummy patterns 701 extend from the long sides of the base substrate 101 to under the semiconductor chip 113.

In the semiconductor device shown in FIG. 7, contact area between the dummy patterns 701 and the sealing resin 117 is wider than that of the semiconductor device shown in FIG. 3. Also contact area between the dummy patterns 701 and the base substrate 101 is wider than that of the semiconductor device shown in FIG. 3. Therefore, the stress can be relieved more effectively.

Second Preferred Embodiment

Figure 8:
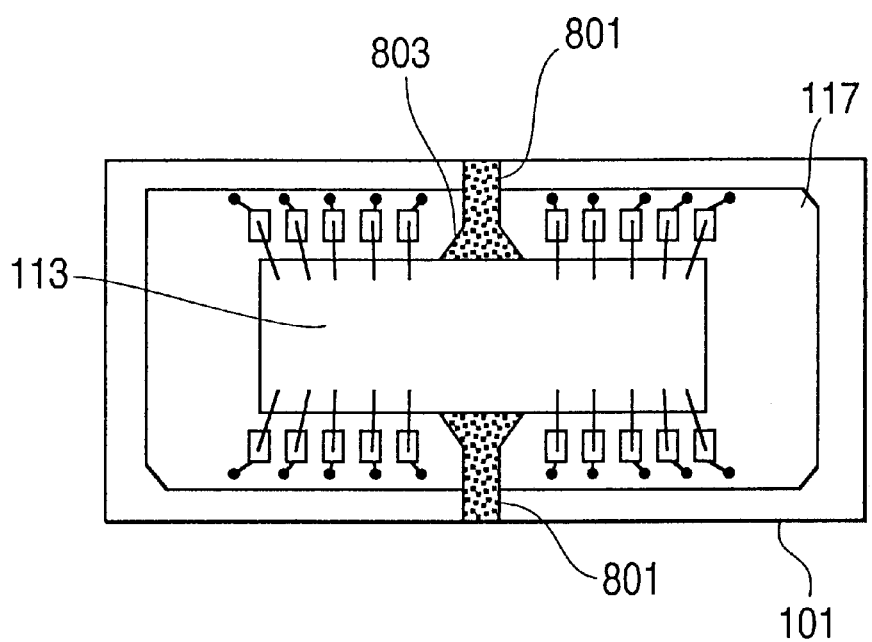
FIG. 8 is a top plan view showing a semiconductor device according to a second preferred embodiment of the present invention.

FIG. 8 is a top plan view showing a semiconductor device according to a second preferred embodiment of the present invention. The difference between FIG. 8 and FIG. 3 resides in the shape of dummy patterns 801. Elements except for the dummy patterns 801 are the same as those of FIG. 3.

As illustrated in FIG. 8, the dummy patterns 801 have tapered portions 803. Each width of the tapered portions 803 in the x-direction gradually decreases with increasing distance from the semiconductor chip 113.

It is possible to relieve the stress because of this shape, more easily than the first preferred embodiment.

Third Preferred Embodiment

Figure 9:
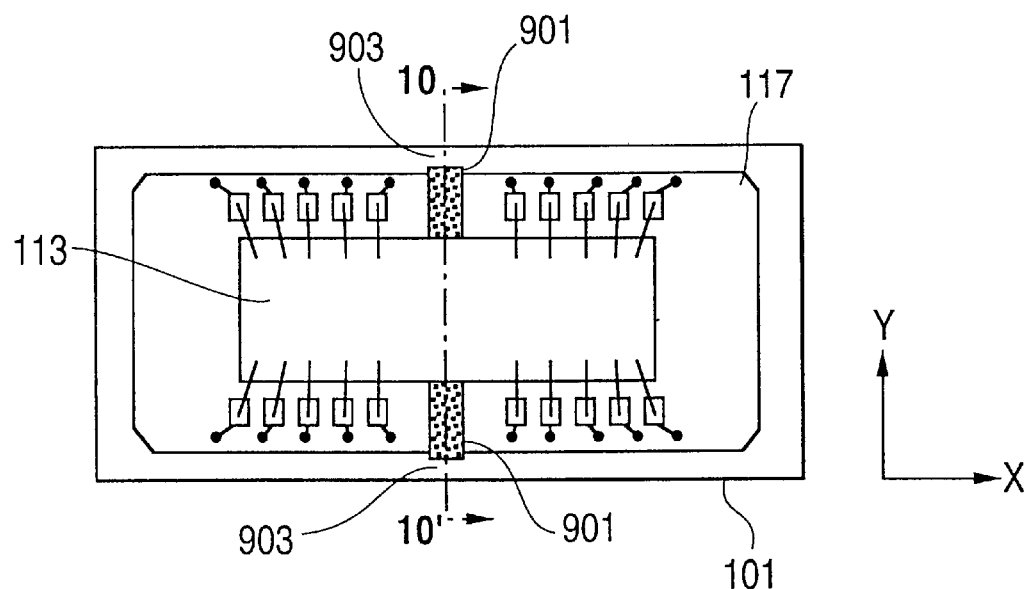
FIG. 9 is a top plan view showing a semiconductor device according to a third preferred embodiment of the present invention.
Figure 10:
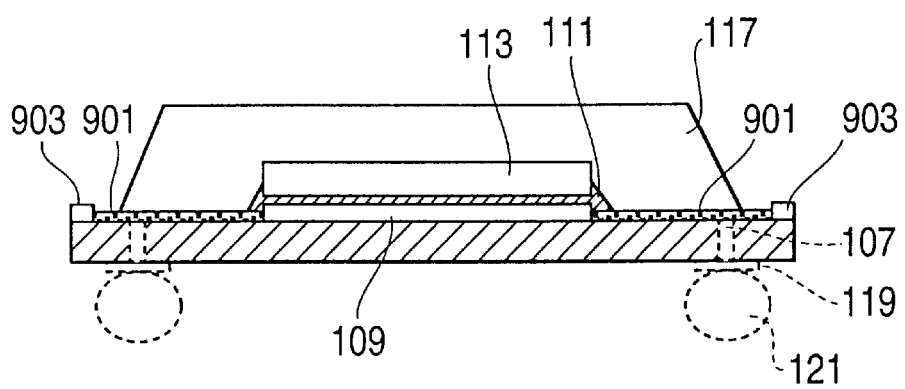
FIG. 10 is a cross sectional view taken on line 10–10' of FIG. 9.

FIG. 9 is a top plan view showing a semiconductor device according to a third preferred embodiment of the present invention. FIG. 10 is a cross sectional view taken on line 10–10' of FIG. 9.

The difference between the third preferred embodiment and the first preferred embodiment is that the solder resist layer 109 is also formed at a region adjacent to the center of the long sides of the base substrate 101. The solder resist layer 109 formed at the region serves as an antiflowing member 903 for preventing the sealing resin from flowing outside.

In the third preferred embodiment, the shape of the dummy patterns 901 are slightly different from that of the first preferred embodiment.

For example, the thickness of the dummy pattern 901 is thinner than that of the solder resist layer 109. Other elements are the same as those of the first preferred embodiment.

As illustrated in FIG. 10, position of the top surface of the antiflowing member 903 is higher than that of the dummy pattern 901. Or the thickness of the antiflowing member 903 is thicker than that of the dummy pattern 901.

Therefore, when the sealing resin 117 is provided on the dummy patters 901 having the relatively low adhesion strength, the antiflowing member 903 can prevent the sealing resin 117 from flowing outside of the base substrate 101 through the dummy patterns 901.

In the third preferred embodiment, advantages explained hereinafter also can be obtained, in addition to the advantages of the first preferred embodiment.

That is, the third preferred embodiment can prevent the sealing resin 117 from flowing outside of the base substrate 101 during a resin sealing process.

Therefore, the semiconductor device which enables to relieve the stress can be obtained. Furthermore, the semiconductor device which do not have outline defective of the sealing resin can be obtained.

Furthermore, it is possible to execute the resin sealing process stably.

Fourth Preferred Embodiment

Figure 11:
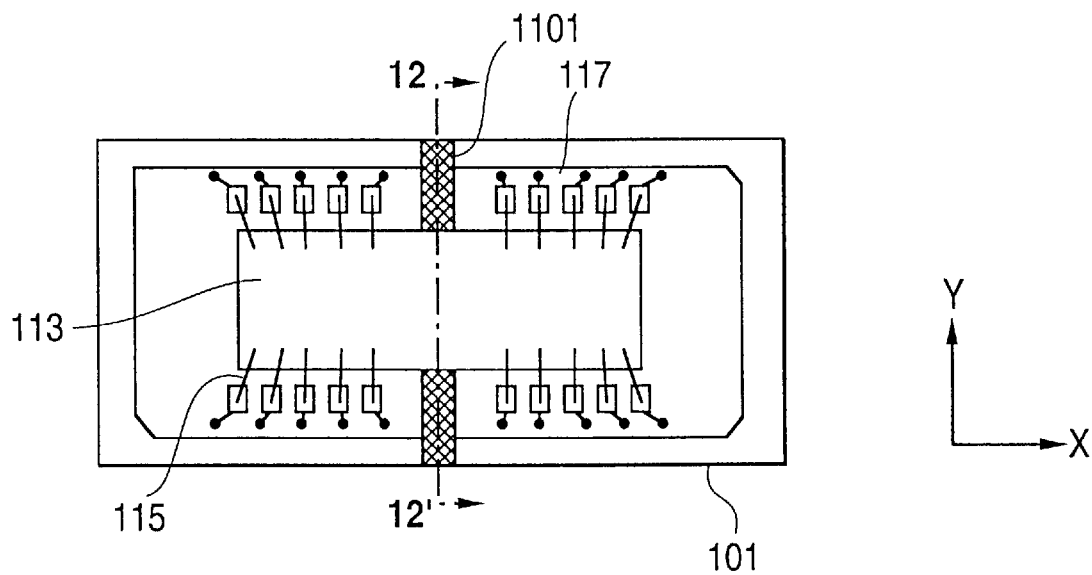
FIG. 11 is a top plan view showing a semiconductor device according to a fourth preferred embodiment of the present invention.
Figure 12:
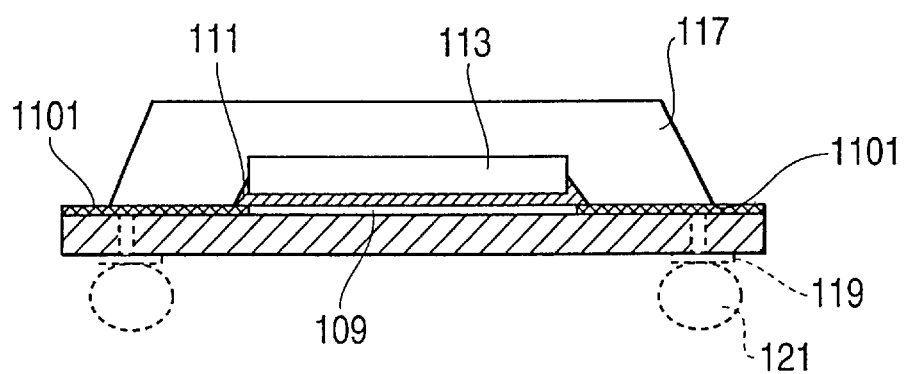
FIG. 12 is a cross sectional view taken on line 12–12' of FIG. 11.

FIG. 11 is a top plan view showing a semiconductor device according to a fourth preferred embodiment of the present invention. FIG. 12 is a cross sectional view taken on line 12–12' of FIG. 11.

The difference between the fourth preferred embodiment and the first preferred embodiment is that a solder resist layer 1101 is provided at the stress concentrated region instead of the dummy pattern 301. Other elements are the same as those of the first preferred embodiment.

The solder resist layer 1101 is formed on the front surface of the base substrate 101 between the semiconductor chip 113 and the center of the long sides of the base substrate 101. More precisely, the solder resist layer 1101 is not applied to the ashing process. Therefore, the solder resist layer 1101 has the relatively low adhesion strength against the sealing resin 117 compared to the solder resist layer 109 applied to the ashing process.

The solder resist layer 109 except for the solder resist layer 1101 is applied to the ashing process using the ultraviolet rays or plasma.

The solder resist layer 109 has the relatively high adhesion strength against the sealing resin 117. Especially, the adhesion strength against the sealing resin 117 of the soldr resist layer 109 is higher than that of the solder resist layer 1101.

Next, a method for making a semiconductor device according to the fourth preferred embodiment of the present invention will be explained hereinafter with reference to FIG. 13 and FIG. 14.

FIG. 13 and FIG. 14 are process diagrams showing the method for making the semiconductor device according to the fourth preferred embodiment of the present invention.

Figure 13A:
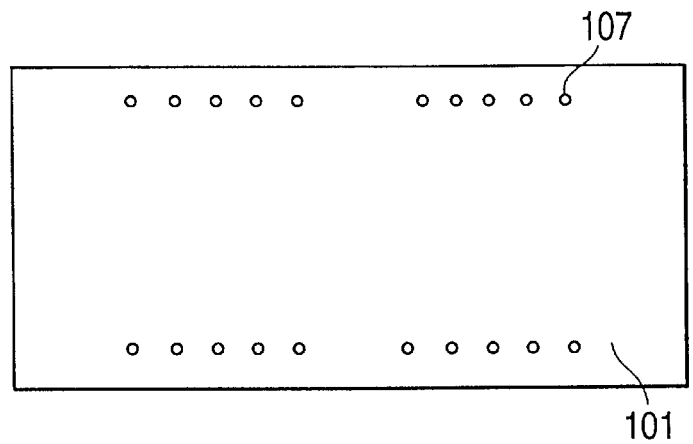
FIG. 13(a) through FIG. 13(c) are process diagrams showing a method for making a semiconductor device according to a fourth preferred embodiment of the present invention.

First, as shown in FIG. 13(a), the base substrate 101 having the copper foil which is formed on the front and back surfaces thereof is provided.

Next, the through holes 107 are drilled through the copper foil and the base substrate 101. Or the through holes 107 are formed in the base substrate 101 by using a laser beam.

Figure 13B:
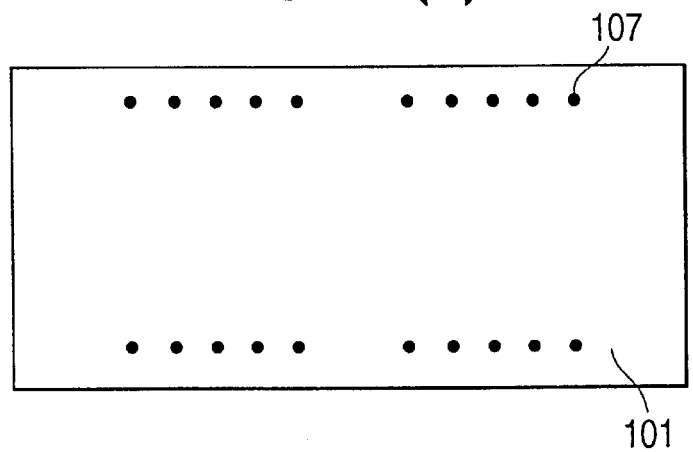

Next, as shown in FIG. 13(b), sides of the through holes 107 are plated with copper. In this time, the front and back surfaces of the base substrate 101 are also plated with the copper.

Figure 13C:
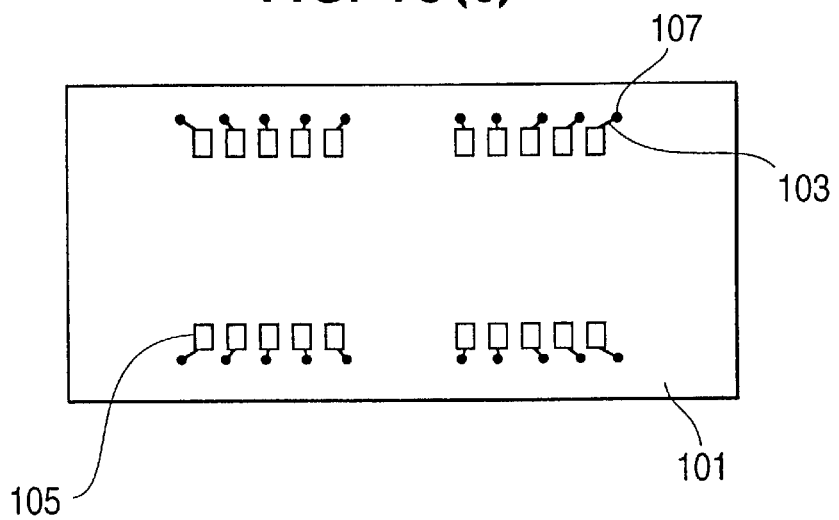

Next, as shown in FIG. 13(c), the bonding pads 105, the wiring patterns 103 and the wiring patterns 119 are formed on both surfaces of the base substrate 101 by sequentially photolithographically masking and etching the copper foil formed on both surfaces of the base substrate 101.

It should be noted that the wiring patterns 119 are not illustrated because the wiring patterns 119 are formed on the back surface of the base substrate 101. Further, in order to simplify explanations, explanations and illustration with respect to the back surface of the base substrate 101 are omitted.

Figure 14A:
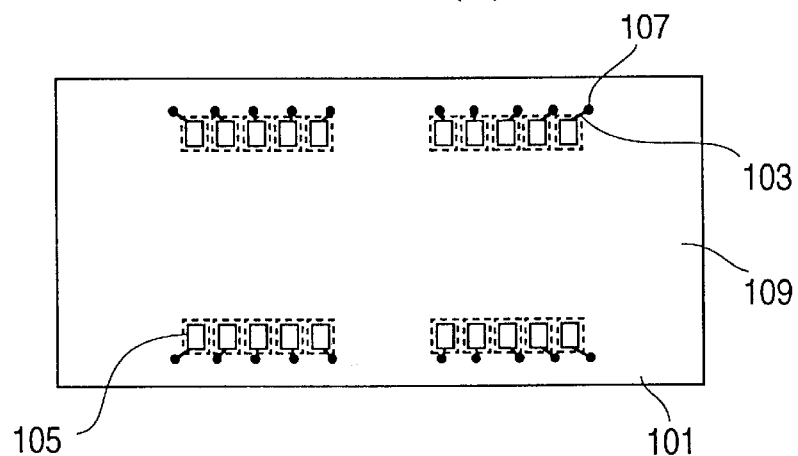
FIG. 14(a) through FIG. 14(c) are process diagrams showing a method for making a semiconductor device according to a fourth preferred embodiment of the present invention.

Next, as shown in FIG. 14(a), the solder resist layer 109 is formed over the overall front surface of the base substrate 101 except for the bonding pads 105.

Thereafter, the nickel and the gold are sequentially plated to exposed surfaces of the bonding pads 105 by using the solder resist layer 109 as a mask. As a result, the bonding pad 105 which has a laminated layer comprising the gold plating layer, the nickel plating layer and the copper plating layer can be obtained.

Figure 14B:
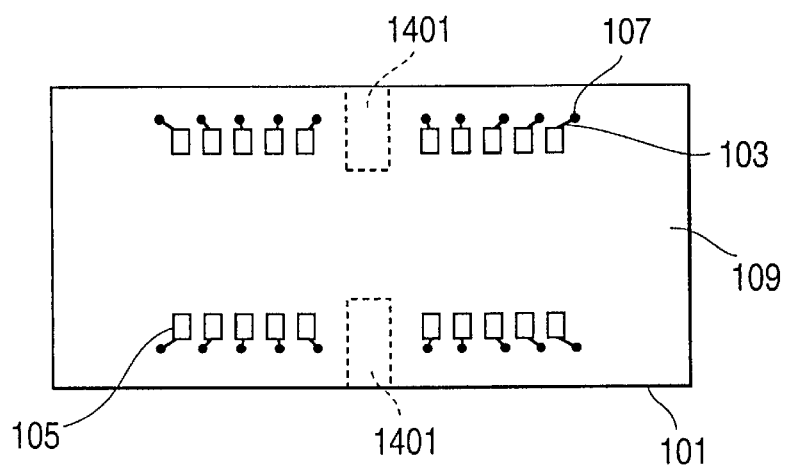

Next, as shown in FIG. 14(b), a surface of the solder resist layer 109 positioned between the center of the long sides of the base substrate 101 and a region on which the semiconductor chip 113 to be mounted is masked. The region is indicated as a region 1401. Thereafter, the ashing process using the ultraviolet rays or plasma is applied to the obtained overall structure.

As a result, the solder resist layer 109 except for the region 1401 is subjected to the ashing process and thus characteristic of the layer is changed. More precisely, the solder resist layer 109 applied to the ashing process has the relatively high adhesion strength against the sealing resin 117.

On the other hand, the solder resist layer 1101 not applied to the ashing process has the relatively low adhesion strength against the sealing resin 117.

Figure 14C:
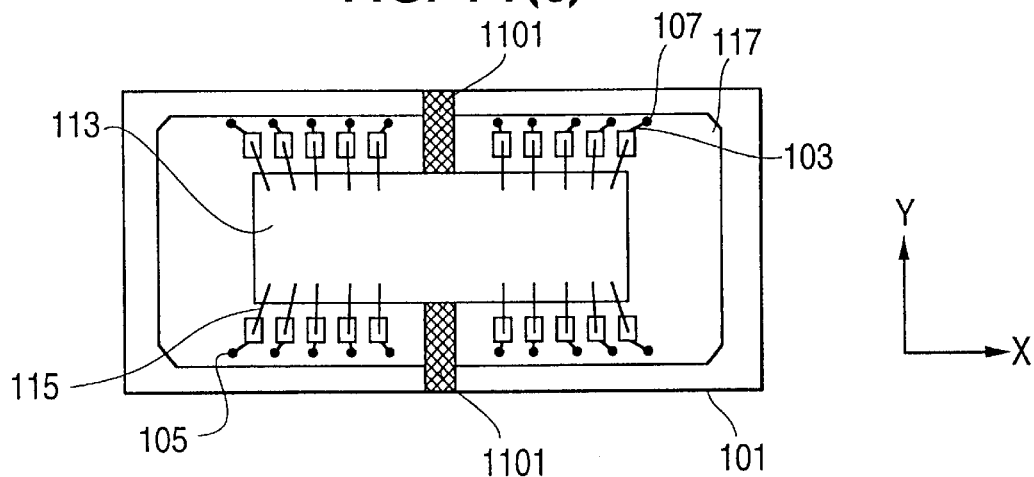

Next, as shown in FIG. 14(c), the electrodes on the semiconductor chip 113 are wire-bonded to the bonding pads 105 by the bonding wires 115.

Thereafter, the sealing resin 117 is provided on a resin seal region of the front surface of the base substrate 101. Thus, the semiconductor chip 113, the bonding wires 115, the bonding pads 105 and the through holes 107 are covered with the sealing resin 117.

Thereafter, the solder balls 121 are mounted on the wiring patterns 119 of the back surface of the base substrate 101 and thus the semiconductor device is completed.

Thereafter, as explained above, the reflow process is applied to the semiconductor device.

The stress occurs at the semiconductor device during the reflow process. The stress is, as explained above, particularly concentrated on a region between the semiconductor chip 113 and the center of the sides of the base substrate 101.

However, the solder resist layers 1101 having the relatively low adhesion strength against the sealing resin 117 exist at the stress concentrated region.

Therefore, the concentrated stress can be relieved at interfaces between the solder resist layers 1101 and the sealing resin 117.

The solder resist layers 1101 are preferably formed on a region between the semiconductor chip 113 and the long sides of the base substrate 101 in order to relieve the stress effectively. Furthermore, width of the solder resist layer in a x-direction illustrated in FIG. 14 are preferably equal to or more than 0.5 mm.

As explained above, in the semiconductor device according to the fourth preferred embodiment of the present invention, since the solder resist layer 1101 having the relatively low adhesion strength against the sealing resin 117 is provided at the stress concentrated region, the stress which occurs during the reflow process can be relieved at the interface between the solder resist layers 1101 and the sealing resin effectively.

Therefore, the crack and the peeling off can be prevented. As a result, a withstand characteristic of the semiconductor device against the reflow process can be sharply improved.

Any special areas for relieving the stress are not needed on the base substrate 101. Therefore, it is possible to use area of the front surface of the base substrate 101 effectively. For example, limits of bonding pad's arrangement can be reduced.

Figure 15A:
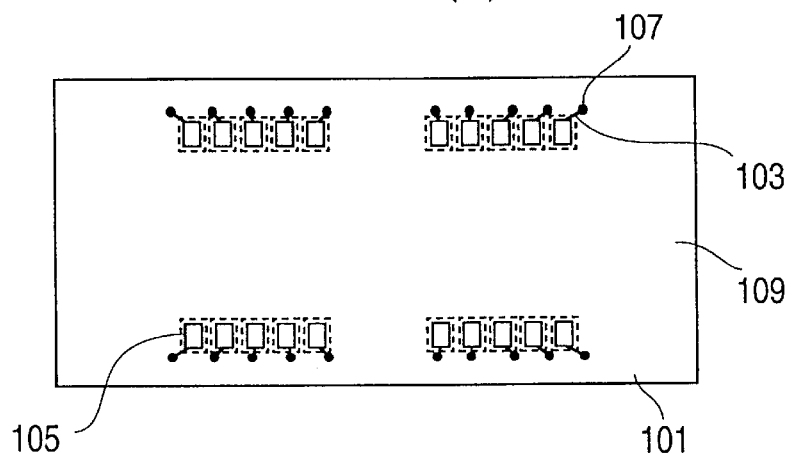
FIG. 15(a) through FIG. 15(c) are process diagrams showing a method for making the semiconductor device according to a variety of the fourth preferred embodiment of the present invention.
Figure 15B:
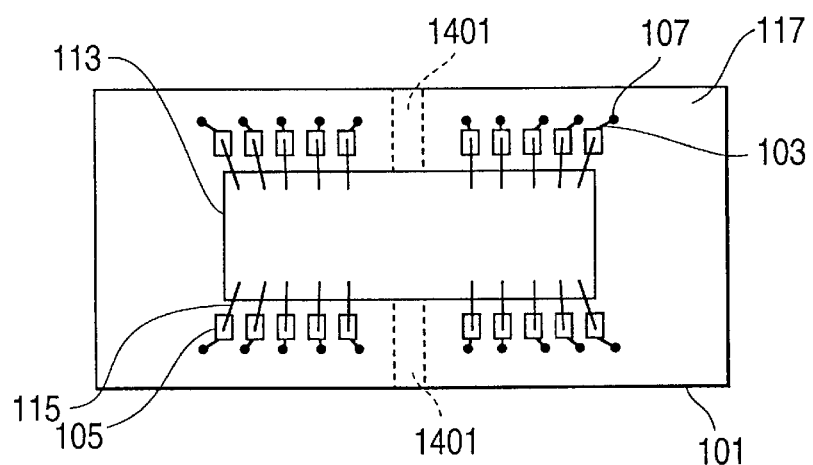
Figure 15C:
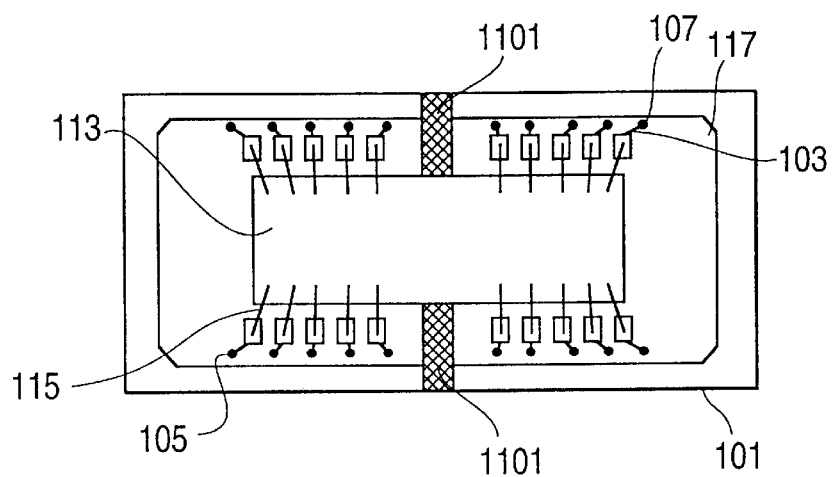

FIG. 15 is a process diagram showing a method for making the semiconductor device according to a variety of the fourth preferred embodiment of the present invention. In this variety of the fourth preferred embodiment, the steps before the step for forming the bonding pads 105 are the same as those of the fourth preferred embodiment illustrated in FIG. 13.

Thereafter, as shown in FIG. 15(a), the solder resist layer 109 is formed over the overall front surface of the base substrate 101 except for the bonding pads 105.

Next, as shown in FIG. 15(b), the electrodes on the semiconductor chip 113 are wire-bonded to the bonding pads 105 by the bonding wires 115. Thereafter, a surface of the solder resist layer 109 positioned between the center of the long sides of the base substrate 101 and the semiconductor chip 113 is masked. The masked regions are indicated as numeral 1401.

Thereafter, the ashing process using the ultraviolet rays or plasma is applied to the obtained overall structure.

As a result, the solder resist layer 109 except for the region 1401 is subjected to the ashing process and thus characteristic of the layer is changed. More precisely, the solder resist layer 109 applied to the ashing process has the relatively high adhesion strength against the sealing resin 117.

On the other hand, the solder resist layer 1101 not applied to the ashing process has the relatively low adhesion strength against the sealing resin 117.

Next, the sealing resin 117 is provided on a resin seal region of the front surface of the base substrate 101. Thus, the semiconductor chip 113, the bonding wires 115, the bonding pads 105, wiring patterns 103 and the through holes 107 are covered with the sealing resin 117.

Thereafter, the solder balls 121 are mounted on the wiring patterns 119 of the back surface of the base substrate 101 and thus the semiconductor device is completed.

In this variety of the fourth preferred embodiment, the ashing process which is applied to the solder resist layer 109 and which enhances the adhesion strength of the solder resist layer 109 against the sealing resin 117 is carried out just before the resin seal process.

That is, the resin seal process is carried out before the effect of the ashing process decreases.

The semiconductor device thus may relieve the stress and may reduce a possibility that the sealing resin is peeled off from the solder resist layer.

While the preferred form of the present invention has been described, it is to be understood that modifications will be apparent to those skilled in the art without departing from the spirit of the invention. The scope of the invention is to be determined solely by the following claims.

What is claimed is:

1. A semiconductor device comprising:
   a base substrate which has four sides, a first major surface and a second major surface opposite to the first major surface;
   a semiconductor chip which is mounted on the first major surface and has an electrode formed thereon;
   a bonding pad which is formed on the first major surface;
   a wiring pattern which is formed on the first major surface and is connected to said bonding pad;
   a bonding wire which connects the electrode of said semiconductor chip to said bonding pad;
   a dummy pattern which is formed on the first major surface positioned between a center of one side of said base substrate and said semiconductor chip; and
   a sealing resin formed on and covering said semiconductor chip, said bonding wire, said bonding pad and a part of said dummy pattern, whereby a portion of said dummy pattern on said base substrate is exposed.

2. A semiconductor device as set forth in claim 1, wherein said dummy pattern includes a layer plated with gold or nickel.

3. A semiconductor device as set forth in claim 2, wherein said dummy pattern includes a tapered portion having width, the width of the tapered portion gradually decreases with increasing distance from said semiconductor chip.

4. A semiconductor device as set forth in claim 3, further comprising an antiflowing member which is formed at a region adjacent to the center of the one side of said base substrate and prevents said sealing resin from flowing outside of said base substrate.

5. A semiconductor device as set forth in claim 1, wherein said dummy pattern includes a tapered portion having width, the width of the tapered portion gradually decreases with increasing distance from said semiconductor chip.

6. A semiconductor device as set forth in claim 5, further comprising an antiflowing member which is formed at a region adjacent to the center of the one side of said base substrate and prevents said sealing resin from flowing outside of said base substrate.

7. A semiconductor device as set forth in claim 1, further comprising an antiflowing member which is formed at a region adjacent to the center of the one side of said base substrate and prevents said sealing resin from flowing outside of said base substrate.

8. A semiconductor device comprising:
   a base substrate which has four sides, a first major surface and a second major surface opposite to the first major surface;
   a semiconductor chip which is mounted on the first major surface and has an electrode formed thereon;
   a bonding pad which is formed on the first major surface;
   a wiring pattern which is formed on the first major surface and is connected to said bonding pad;
   a bonding wire which connects the electrode of said semiconductor chip to said bonding pad;
   a dummy pattern which is formed on the first major surface positioned between a center of one side of said base substrate and said semiconductor chip; and
   a sealing resin formed on and covering said semiconductor chip, said bonding wire, said bonding pad and a part of said dummy pattern,
   an adhesion strength of said dummy pattern with respect to said sealing resin being lower than an adhesion strength of said semiconductor chip with respect to said sealing resin.

9. A semiconductor device as set forth in claim 8, wherein said dummy pattern includes a layer plated with gold or nickel.

10. A semiconductor device as set forth in claim 9, wherein said dummy pattern includes a tapered portion having width, the width of the tapered portion gradually decreases with increasing distance from said semiconductor chip.

11. A semiconductor device as set forth in claim 10, further comprising an antiflowing member which is formed at a region adjacent to the center of the one side of said base substrate and prevents said sealing resin from flowing outside of said base substrate.

12. A semiconductor device as set forth in claim 8, wherein said dummy pattern includes a tapered portion having width, the width of the tapered portion gradually decreases with increasing distance from said semiconductor chip.

13. A semiconductor device as set forth in claim 12, further comprising an antiflowing member which is formed at a region adjacent to the center of the one side of said base substrate and prevents said sealing resin from flowing outside of said base substrate.

14. A semiconductor device as set forth in claim 8, further comprising an antiflowing member which is formed at a region adjacent to the center of the one side of said base substrate and prevents said sealing resin from flowing outside of said base substrate.

15. A semiconductor device comprising:
   a base substrate which has four sides, a first major surface and a second major surface opposite to the first major surface;
   a semiconductor chip which is mounted on the first major surface and has an electrode formed thereon;
   a bonding pad which is formed on the first major surface;
   a wiring pattern which is formed on the first major surface and is connected to said bonding pad;
   a bonding wire which connects the electrode of said semiconductor chip to said bonding pad;
   an insulating layer which is formed over the first major surface except for said bonding pad, said insulating layer having a first region positioned between a center of one side of said base substrate and said semiconductor chip and having a second region; and
   a sealing resin formed on and covering said semiconductor chip, said bonding wire, said bonding pad, a part of the first region and a part of the second region,
   an adhesion strength of the first region with respect to said sealing resin being lower than an adhesion strength of the second region with respect to said sealing resin.

16. A semiconductor device as set forth in claim 15, wherein the second region of said insulating layer is an ashed insulating material and the first region of said insulating layer is a non-ashed insulating material.

17. A semiconductor device comprising:
   a base substrate which has four sides, a first major surface and a second major surface opposite to the first major surface;
   a semiconductor chip which is mounted on the first major surface and has an electrode formed thereon;
   a bonding pad which is formed on the first major surface;
   a wiring pattern which is formed on the first major surface and is connected to said bonding pad;
   a bonding wire which connects the electrode of said semiconductor chip to said bonding pad;
   a dummy pattern which is formed on the first major surface positioned between a side of said base substrate and said semiconductor chip; and
   a sealing resin formed on and covering said semiconductor chip, said bonding wire, said bonding pad and a part of said dummy pattern, whereby a portion of said dummy pattern on said base substrate is exposed.

18. A semiconductor device as set forth in claim 17, wherein said dummy pattern includes a layer plated with gold or nickel.

19. A semiconductor device as set forth in claim 17, wherein said dummy pattern includes a tapered portion having width, the width of the tapered portion gradually decreases with increasing distance from said semiconductor chip.

20. A semiconductor device as set forth in claim 17, further comprising an antiflowing member which is formed at a region adjacent to the side of said base substrate and prevents said sealing resin from flowing outside of said base substrate.

* * * * *